US012662751B2

(12) United States Patent
Stettner

(10) Patent No.: US 12,662,751 B2
(45) Date of Patent: Jun. 23, 2026

(54) PROCESS FOR MANUFACTURING SEMICONDUCTOR WAFERS CONTAINING A GAS-PHASE EPITAXIAL LAYER IN A DEPOSITION CHAMBER

(71) Applicant: SILTRONIC AG, Munich (DE)

(72) Inventor: Thomas Stettner, Waging am See (DE)

(73) Assignee: SILTRONIC AG, Munich (DE)

( * ) Notice: Subject to any disclaimer, the term of this patent is extended or adjusted under 35 U.S.C. 154(b) by 445 days.

(21) Appl. No.: 18/554,221

(22) PCT Filed: Mar. 28, 2022

(86) PCT No.: PCT/EP2022/058094
§ 371 (c)(1),
(2) Date: Oct. 6, 2023

(87) PCT Pub. No.: WO2022/218678
PCT Pub. Date: Oct. 20, 2022

(65) Prior Publication Data
US 2024/0117523 A1 Apr. 11, 2024

(30) Foreign Application Priority Data

Apr. 13, 2021 (EP) ..................................... 21167990

(51) Int. Cl.
*C30B 25/16* (2006.01)
(52) U.S. Cl.
CPC ..................................... *C30B 25/16* (2013.01)
(58) Field of Classification Search
CPC ..................................................... C30B 25/16

(Continued)

(56) References Cited

U.S. PATENT DOCUMENTS

2006/0086462 A1 4/2006 Inada et al.
2018/0363165 A1 12/2018 Hager et al.

FOREIGN PATENT DOCUMENTS

JP 5704461 B2 4/2015
JP 2016213218 A 12/2016

(Continued)

*Primary Examiner* — Phuc T Dang
(74) *Attorney, Agent, or Firm* — LEYDIG, VOIT & MAYER, LTD.

(57) ABSTRACT

Disclosed is a process for manufacturing semiconductor wafers containing a gas-phase epitaxial layer in a deposition chamber, involving removing, from the deposition chamber by etching the deposition chamber, material settled in the deposition chamber during preceding coating processes; performing successive coating operations in the etched deposition chamber, each of said coating operations involving having a robot place a substrate wafer on a susceptor having a circular circumference, the robot moving the substrate wafer into a drop-off position and placing it on the susceptor, the center of the substrate wafer not lying over the center of the susceptor in the drop-off position because of a predefined corrective parameter; and depositing an epitaxial layer on the substrate wafer such that a semiconductor wafer containing an epitaxial layer is produced, characterized in that for each first substrate wafer moved by the robot into the drop-off position, the value of the predefined corrective parameter corresponds to a mean value of differences in the positions of a number of previously coated substrate wafers which had been the first substrate wavers to be coated following a preceding chamber etching operation.

2 Claims, 4 Drawing Sheets

(58) Field of Classification Search
  USPC ......................................................... 438/478
  See application file for complete search history.

(56)                    References Cited

FOREIGN PATENT DOCUMENTS

KR      20010014796  A  *  2/2001  ....... H01L 21/68248
KR      20130035889  A  *  4/2013  ............ C30B 25/16
WO   WO-2017102597  A1 *  6/2017  ....... H01L 21/02532

* cited by examiner

PROCESS FOR MANUFACTURING SEMICONDUCTOR WAFERS CONTAINING A GAS-PHASE EPITAXIAL LAYER IN A DEPOSITION CHAMBER

CROSS REFERENCE TO RELATED APPLICATIONS

This application is a U.S. National Phase application under 35 U.S.C. § 371 of International Application No. PCT/EP2022/058094, filed on Mar. 28, 2022, and claims benefit to European Patent Application No. EP21167990, filed on Apr. 13, 2021. The International Application was published in German on Oct. 20, 2022 as WO 2022/218678 A1 under PCT Article 21(2).

FIELD

The present disclosure relates to a process for producing semiconductor wafers with epitaxial layer deposited from the gas phase in a deposition chamber.

BACKGROUND

Semiconductor wafers with an epitaxial layer are required for the production of electronic components. The epitaxial layer is typically deposited in a deposition chamber, which takes the form of a single-wafer reactor. The substrate wafer to be coated is placed on a susceptor, and a deposition gas is passed at a deposition temperature through the deposition chamber over the substrate wafer, which rotates with the susceptor.

One quality criterion of semiconductor wafers with an epitaxial layer is the uniformity of the thickness of the epitaxial layer, especially in the edge region of the semiconductor wafer.

WO 2017 102 597 A1 is devoted in particular to the problem of improving the edge geometry of a semiconductor wafer with epitaxial layer. It was found that after a typical etch regularly carried out in the deposition chamber (chamber etching) to remove material having deposited in the deposition chamber in the course of preceding coating operations, successive subsequent coating operations result in an increase in edge roll-off in semiconductor wafers with epitaxial layer that are subsequently produced in the deposition chamber.

JP 2016 213 218 A describes a process for producing semiconductor wafers of monocrystalline silicon with epitaxial layer made of monocrystalline silicon. It is recommended that a robot which places the substrate wafer onto the susceptor of a deposition reactor is moved to a placement position in which, owing to a corrective precept, the center of the substrate wafer does not lie above the center of the susceptor. It has been found that otherwise the substrate wafers on average do not lie centered on the susceptor during the deposition of the epitaxial layer. If the substrate wafer is not located concentrically in the pocket of the susceptor during the deposition of the epitaxial layer, there is an adverse effect on the uniformity of the thickness of the epitaxial layer. Furthermore, any such misposition may result in unwanted formation of particles, particularly if it entails contact of the edge of the substrate wafer with the susceptor. The corrective precept is derived from an average which describes the mean deviation of the position of the center of substrate wafers from the center of the susceptor during preceding coating operations. Linked with the corrective precept is the expectation of achieving, during a coating operation, a position of the center of the substrate wafer that is closer, by the amount of the mean deviation, to the center of the susceptor than if there had been no corrective precept.

SUMMARY

In an embodiment, the present disclosure provides a process that produces semiconductor wafers with an epitaxial layer deposited from a gas phase in a deposition chamber. The process includes: removing, from the deposition chamber, material which has deposited in the deposition chamber in a course of preceding coating operations, by etching of the deposition chamber; coating operations carried out in succession in the etched deposition chamber, in each case comprising: placing a substrate wafer on a susceptor with circular perimeter by a robot, where the robot moves the substrate wafer into a placement position and places it on the susceptor, with a corrective precept causing a center of the substrate wafer not to lie above a center of the susceptor in the placement position; and depositing the respective epitaxial layer on the substrate wafer to form a semiconductor wafer with the epitaxial layer. For each first substrate wafer moved into the placement position by the robot after the etching of the deposition chamber, an amount of the corrective precept corresponds to an average of positional deviations of a number of previously coated substrate wafers themselves each the first to be coated after a preceding chamber etch.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
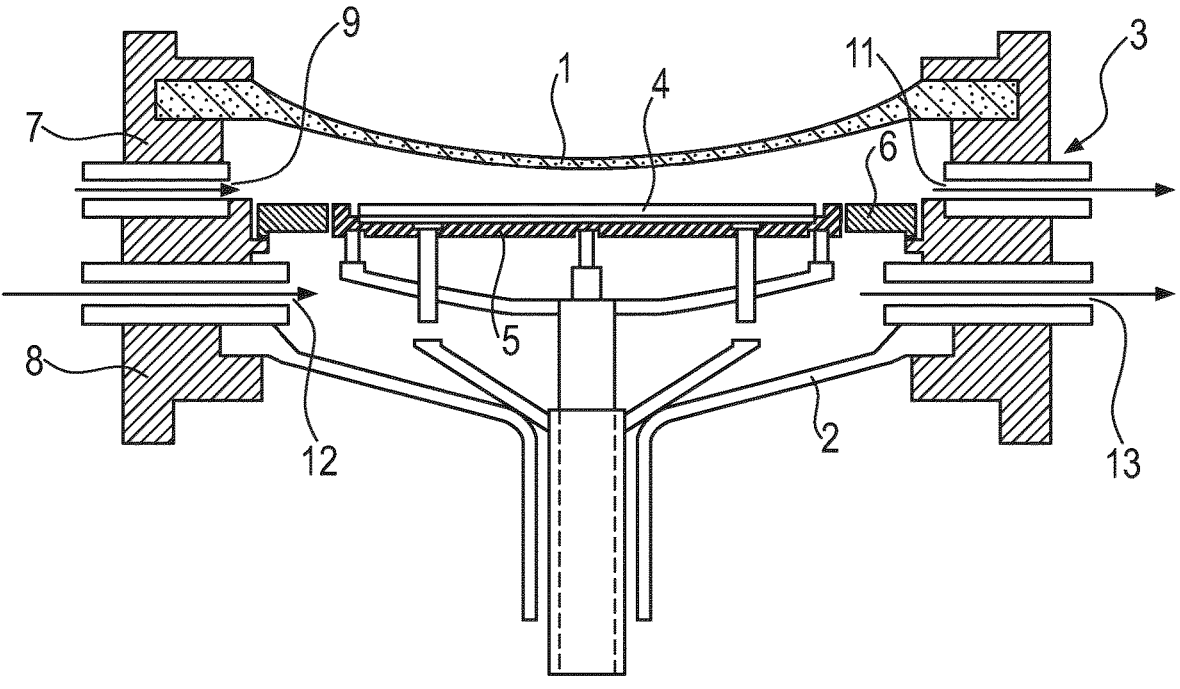
FIG. 1 shows in a sectional representation an apparatus for depositing an epitaxial layer from the gas phase onto a substrate wafer, with typical features.

The inventors of the present disclosure have determined that a specification of the corrective precept which is guided solely by the positional deviation of substrate wafers during preceding coating operations is deserving of improvement.

The present disclosure provides a process for producing semiconductor wafers with epitaxial layer deposited from the gas phase in a deposition chamber, comprising:

the removal from the deposition chamber of material which has deposited in the deposition chamber in the course of preceding coating operations, by etching of the deposition chamber;

coating operations carried out in succession in the etched deposition chamber, in each case comprising:

the placement of a substrate wafer on a susceptor with circular perimeter by a robot, where the robot moves the substrate wafer into a placement position and places it on the susceptor, with a corrective precept causing the center of the substrate wafer not to lie above the center of the susceptor in the placement position; and the deposition of an epitaxial layer on the substrate wafer to form a semiconductor wafer with epitaxial layer, wherein for each first substrate wafer moved into the placement position by the robot after the etching of the deposition chamber, the amount of the corrective precept corresponds to an average of positional deviations of a number of previously coated substrate wafers themselves each the first to be coated after a preceding chamber etch.

Before the first coating operation after chamber etching, the state of the deposition chamber is such that incident radiant energy produces a faster temperature rise than before the second and subsequent coating operations. As a result, the anticipated misposition of the substrate wafer is more pronounced, particularly for the first substrate wafer after chamber etching, than for substrate wafers coated thereafter.

It is therefore provided that the corrective precept for the first substrate wafer to be coated after chamber etching is calculated taking account only of positional deviations of substrate wafers from preceding coating operations that were measured for substrate wafers themselves each the first substrate wafer after a chamber etch. Such substrate wafers are hereinafter called first-category substrate wafers. The corrective precept is calculated by averaging of the positional deviations. The term "positional deviation" describes the deviation in position of the center of a placed substrate wafer relative to the center of the susceptor.

For the calculation of the average (arithmetic mean), positional deviations of preferably at least 3 first-category substrate wafers are used, more preferably the positional deviations of 5 to 10 such substrate wafers. The chamber etches respectively preceding the first-category substrate wafers have preferably themselves immediately preceded the chamber etch after which the coating of the first substrate wafer to be coated takes place.

It is possible in principle for each substrate wafer category to calculate an independent corrective precept on the pattern of the first-category substrate wafers. Generally speaking, however, it is sufficient, for substrate wafers which are not the first wafers after a chamber etch, to calculate a corrective precept which is based on positional deviations of substrate wafers from preceding different coating operations which were not first coating operations after a chamber etch.

Substrate wafers on which an epitaxial layer is deposited in accordance with the present disclosure are semiconductor wafers which comprise a dopant, preferably substrate wafers made of monocrystalline silicon.

The apparatus shown in FIG. 1 for depositing an epitaxial layer on a substrate wafer comprises a deposition chamber 3 having an upper cover 1 and a lower cover 2, and upper and lower linings 7 and 8, which enclose a reaction space. Upper and lower lamp arrays may be present outside the deposition chamber 3. The radiant energy of the lamps brings the deposition chamber to the temperature that is needed for the gas-phase (vapor) deposition.

For a coating operation, a substrate wafer 4 is placed on a susceptor 5, which is held rotatably from below by arms of a carrier. Beforehand the substrate wafer is placed onto an end effector of a robot and is moved by the robot to a placement position. Arranged around the susceptor is a preheat ring 6. The substrate wafer 4 can be placed on the susceptor 5 and, after coating, lifted off from the susceptor 5 by means of lifting pins which go through the susceptor 5.

In the coating of the substrate wafer 4, deposition gas is passed through upper gas entry apertures 9, provided in the upper lining 7, into the deposition chamber 3 along a flow direction over the substrate wafer to an upper gas outlet 11. Optionally, furthermore, lower gas entry apertures 12 and a lower gas outlet 13 may be provided, in order for a purge gas to be passed under the susceptor 5 through to the lower gas outlet 13.

If the placement position for the robot is established such that the center of the substrate wafer lies perpendicularly above the center of the susceptor, there is a comparatively high probability that after the substrate wafer has been placed, its center will not lie in the center of the susceptor. The particular reason for this are thermal stresses, which resolve, causing the center of the substrate wafer to be shifted from the intended position.

It has now been found that the smaller the number of coating operations completed since the last chamber etch, the larger the amount of the shift from the center of the susceptor. In accordance with the present disclosure, this finding is taken into account when calculating the corrective precept which codetermines the placement position into which the robot moves a substrate wafer before it is placed onto the susceptor. The corrective precept is calculated, for the respectively first substrate wafer to be coated after a chamber etch, by averaging from positional deviations of previously coated substrate wafers, with the positional deviations used for the calculation being only those positional deviations of first-category substrate wafers, i.e., of substrate wafers themselves each the first to be coated after a chamber etch.

Without the proposed averaging based on membership of the first category, unspecific averaging of positional deviations would result in a corrective precept which would be less accurate, since the particular influence of the positional deviation immediately after a chamber etch would be averaged out. The corrective precept ought, however, to be extremely precise, because a centered position of the substrate wafer on the susceptor has advantageous consequences for the edge geometry of the resultant semiconductor wafer with epitaxial layer and there is also a decrease in the risk of particles being generated during the deposition of the epitaxial layer.

Figure 2:
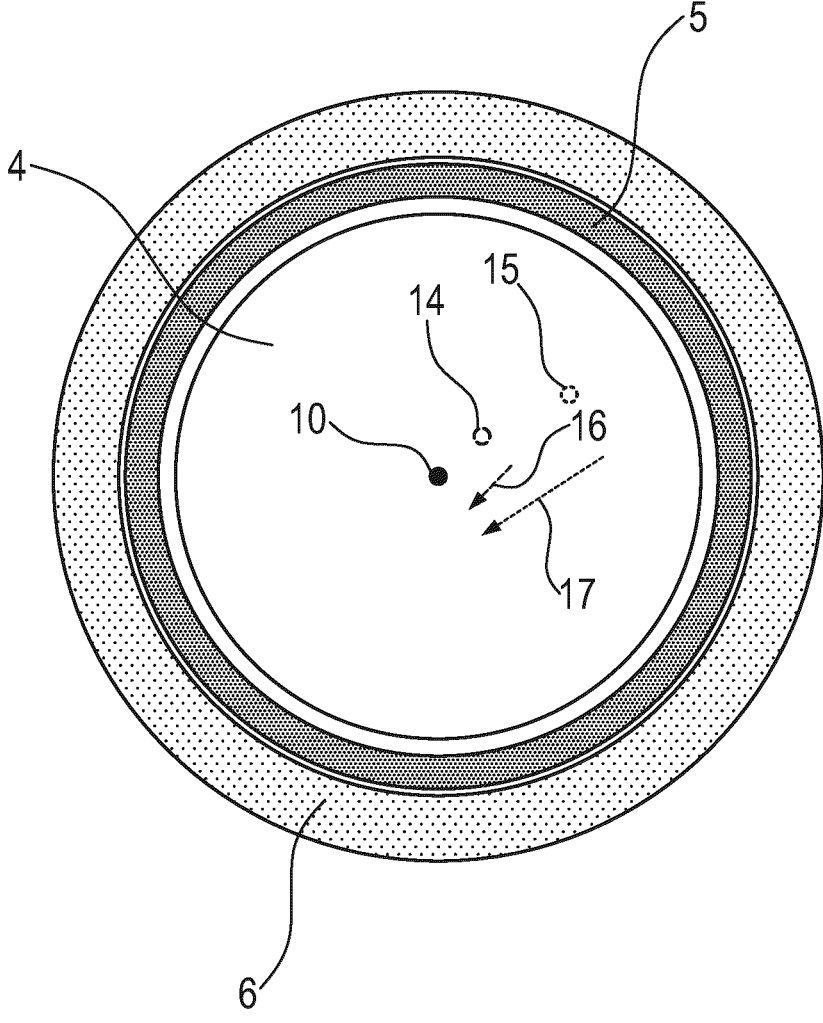
FIG. 2 shows the positions of a first and second average value of positional deviations of first-category substrate wafers and substrate wafers of a different category relative to the center of the susceptor.

FIG. 2 shows a substrate wafer 4 which is placed on a susceptor 5, so that the center 10 of the susceptor 5 is coincident with the center of the substrate wafer 4. In this target position, the substrate wafer 4 is concentric with respect to the susceptor 5 and to the preheat ring 6. Without a corrective precept, the center of the substrate wafer, depending on its membership of the first or a different category, would lie on or in the vicinity of the average position which has been calculated for this category—for example, on or in the vicinity of the first average position 15 in the case of membership of the first category, or on or in the vicinity of the second average position 14 in the case of membership of a different category. In the drawing, the positions 14 and 15 lie an unrealistic distance away from the center 10 of the susceptor, in order to be able to illustrate the present disclosure. In actual fact, typical positional deviations are not more than 1000 μm distant from the center 10 of the susceptor.

A distance between the first average position 15 and the center 10 of the susceptor 5 corresponds to the length of the vector 17. A distance between the second average position 14 and the center 10 of the susceptor 5 corresponds to the length of the vector 16. If the vector 16 or the vector 17 is shifted, so that its start is coincident with the center 10 of the susceptor, the point of the vector points to the placement position into which the robot is required to move the substrate wafer with its center in order to compensate for an anticipated positional deviation. The vector 17 therefore represents the corrective precept for the robot in relation to the first substrate wafer to be coated after a chamber etch, the vector 16 the corrective precept for the robot in relation to substrate wafers of different categories.

Figure 3:
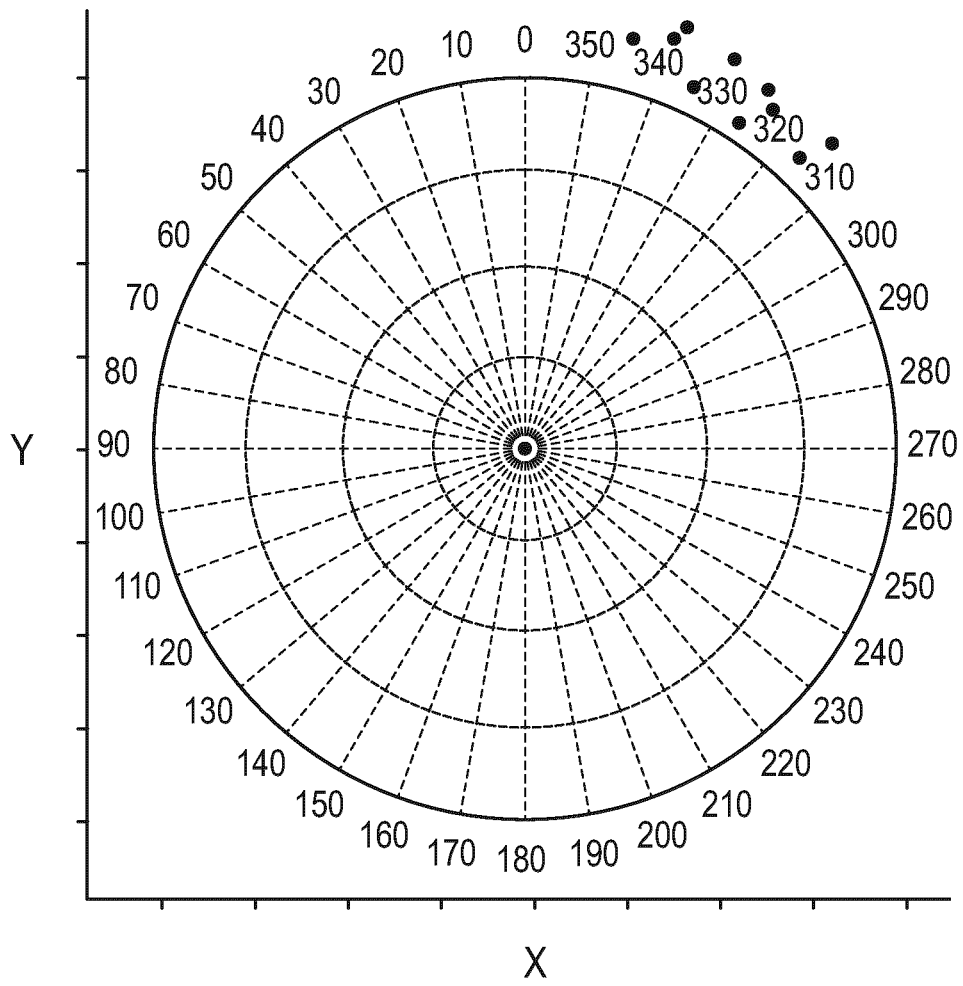
FIG. 3 shows the distribution of the centers of first-category substrate wafers after placement on the susceptor relative to the center of the susceptor in a polar coordinate lattice.
Figure 4:
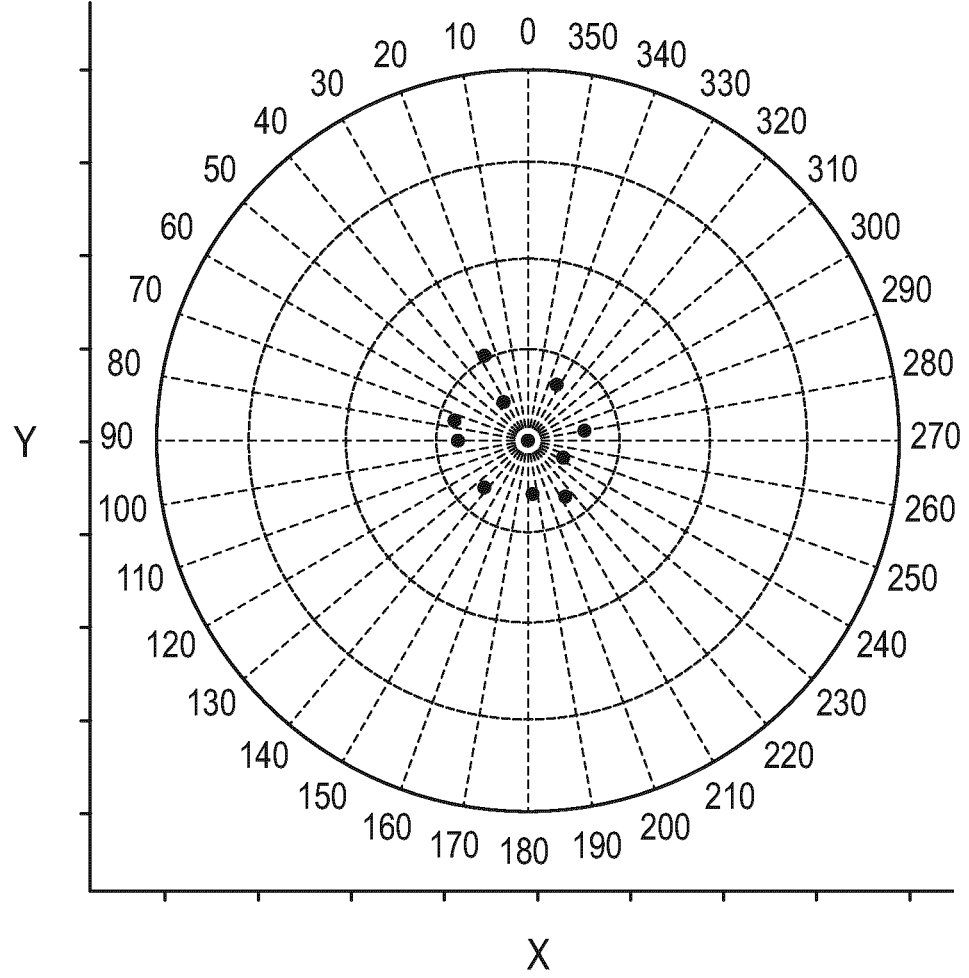
FIG. 4 shows the distribution of the centers of substrate wafers of a different category after placement on the susceptor relative to the center of the susceptor in a polar coordinate lattice.

For first-category substrate wafers (number of coating operations having taken place since the last chamber etch is zero) and, respectively, for substrate wafers of a different category (number of coating operations having taken place since the last chamber etch is 7), FIG. 3 and FIG. 4 show measured positional deviations of the boron-doped substrate wafers made of monocrystalline silicon having a diameter of 300 mm in a polar coordinate lattice. The comparison of the depicted distributions of the positional deviations makes it clear that the amount of the positional deviation is significantly more pronounced if the substrate wafers in question are first-category wafers coated immediately after a chamber etch.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS USED

1 upper cover
2 lower cover
3 deposition chamber
4 substrate wafer
susceptor
6 preheat ring
7 upper lining
8 lower lining
9 upper gas entry apertures
center of the susceptor
11 upper gas outlet
12 lower gas entry apertures
13 lower gas outlet
14 second average position of the center of placed substrate wafers
15 first average position of the center of placed substrate wafers
16 vector
17 vector

What is claimed is:

1. A process for producing semiconductor wafers with an epitaxial layer deposited from a gas phase in a deposition chamber, the process comprising:

removing, from the deposition chamber, material which has deposited in the deposition chamber in a course of preceding coating operations, by etching of the deposition chamber;

coating operations carried out in succession in the etched deposition chamber, in each case comprising:

placing a substrate wafer on a susceptor with circular perimeter by a robot, where the robot moves the substrate wafer into a placement position and places it on the susceptor, with a corrective precept causing a center of the substrate wafer not to lie above a center of the susceptor in the placement position; and depositing the respective epitaxial layer on the substrate wafer to form a semiconductor wafer with the epitaxial layer, wherein:

for each first substrate wafer moved into the placement position by the robot after the etching of the deposition chamber, an amount of the corrective precept corresponds to an average of positional deviations of a number of previously coated substrate wafers themselves each the first to be coated after a preceding chamber etch.

2. The process as claimed in claim 1, wherein the number of the previously coated substrate wafers is at least three.

* * * * *